United States Patent [19]

Walker

[11] Patent Number: 4,978,958
[45] Date of Patent: Dec. 18, 1990

[54] A/D CONVERTER

[75] Inventor: Noel A. Walker, Royal Oak, Mich.

[73] Assignee: Ford Motor Company, Dearborn, Mich.

[21] Appl. No.: 419,803

[22] Filed: Oct. 11, 1989

Related U.S. Application Data

[63] Continuation-in-part of Ser. No. 382,515, Jul. 20, 1989.

[51] Int. Cl.⁵ .................................................. H03M 1/34
[52] U.S. Cl. ....................................... 341/159; 341/164
[58] Field of Search .............. 341/159, 161, 162, 164, 341/165, 155

[56] References Cited

U.S. PATENT DOCUMENTS

| | | | |
|---|---|---|---|
| 3,100,298 | 8/1963 | Fluhr | 340/347 |
| 3,696,400 | 10/1972 | Lang | 341/159 |
| 3,930,253 | 12/1975 | Maida | 340/347 AD |
| 3,968,486 | 7/1976 | Gerdes | 340/347 AD |
| 4,034,366 | 7/1977 | Memishian, Jr. | 340/347 AD |
| 4,275,386 | 6/1981 | Michel et al. | 341/159 |
| 4,306,224 | 12/1981 | Geller et al. | 340/347 AD |
| 4,354,175 | 10/1982 | Goldstein | 340/347 AD |
| 4,533,903 | 8/1985 | Yamada et al. | 341/159 |
| 4,612,531 | 9/1986 | Dingwall et al. | 341/159 |
| 4,771,266 | 9/1988 | Nunokawa | 341/161 |
| 4,902,970 | 2/1990 | Suquet | 341/155 |

Primary Examiner—William M. Shoop, Jr.
Assistant Examiner—Marc S. Hoff
Attorney, Agent, or Firm—Paul K. Godwin, Jr.; Clifford L. Sadler

[57] ABSTRACT

Method and apparatus for sampling an analog voltage and providing a digital representation of the sampled voltage by binary switching individual resistive networks in parallel with a reference leg of a comparator circuit and combining binary switching signals with the comparator output signal.

8 Claims, 1 Drawing Sheet

| A | B | C | |
|---|---|---|---|
| 1 | 1 | 0 | Above Level IV |
| | | 1 | Below Level IV |
| 1 | 0 | 0 | Above Level III |
| | | 1 | Below Level III |
| 0 | 1 | 0 | Above Level II |
| | | 1 | Below Level II |
| 0 | 0 | 0 | Above Level I |
| | | 1 | Below Level I |

Hot
— IV
Warm
— III
Normal
— II
Cool
— I
Cold

A/D CONVERTER

RELATED APPLICATION

The present invention is a continuation-in-part of U.S. Ser. No. 382,515, filed July 20, 1989, entitled "Method and Apparatus for Determining Engine Oil Change Intervals According to Actual Engine Use".

FIELD OF THE INVENTION

The present invention is directed to the area of analog voltage measurement circuits and more specifically to an A/D converter used for making such measurements.

BACKGROUND OF THE INVENTION

As noted in the parent application, the A/D converter of the present invention is used in implementing an engine oil wear indicator whereby a microcontroller periodically measures the temperature of oil in the engine. By progressing through a series of predetermined steps of applying predetermined binary signals to the circuit, the A/D converter compares an analog voltage, which varies with the engine temperature to various reference voltages and determines the relative value of the analog voltage with respect to the reference voltage values.

SUMMARY OF THE INVENTION

The present invention includes a single comparator circuit which provides a first distinguishable output signal when the voltage at its input terminals are in either of two conditions. The first condition being that the voltage at a first terminal is greater than the voltage present at a second terminal. The second condition being that the voltage present at the first terminal is less than the voltage present at the second terminal. In the case of the present invention, the first terminal is connected to sample an analog voltage. The second terminal is connected to a reference voltage divider circuit in which one or more (N) resistance values can be switched in parallel between the second terminal and ground.

The reference voltage divider circuit includes at least two reference resistors connected in series between a D.C. voltage source and ground. "N" switchable resistive networks are connected in parallel with at least one of the series resistors in the referenced voltage divider circuit and each of the N switchable resistive networks contains means for individually switching the corresponding network into and out of electrical parallel connection with one of the series reference resistors. Each of the N switchable resistive networks includes at least one resistor connected in series with an electrical switch that is controllable to open and close in response to applied binary signals. Each switch also contains to a corresponding control terminal. By applying a predetermined set of binary signals to the N control terminals, one (for instance, the lowest or highest) of "L" selected D.C. reference levels (wherein $L=2^N$) is applied to the reference input terminal of the comparator. The output terminal of the comparator will provide an indication as to whether or not the sampled voltage is above or below the reference level. The selection of binary signals applied to the N control terminals combined with the monitored binary output signal from the comparing means provides a combined digital indication of whether or not the sampled analog signal value is at least within "R" adjacent voltage ranges (wherein $R=L-1$) and outside the ranges.

DETAILED DESCRIPTION OF THE PREFERRED EMBODIMENT

Figures 1, 2:
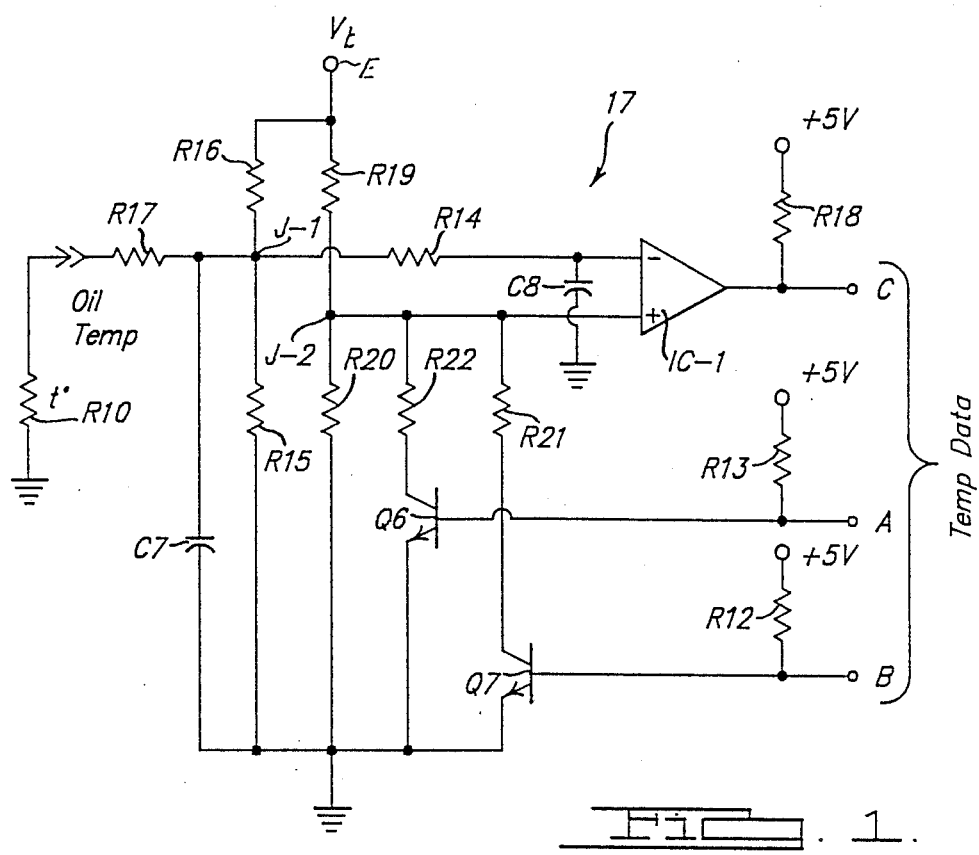
FIG. 1 is a schematic of a preferred embodiment of the present invention.
FIG. 2 is a truth table of the predetermined binary input and output signals correlated with the present invention.

As shown in FIG. 1, the A/D converter 17 of the present invention includes a pair of input data terminals A and B and a single output data terminal C. In the disclosed embodiment of the parent application, those terminals are connected to provide temperature data to a microcomputer (not shown). The input terminals A and B are selectively controlled with predetermined high (1) or low (0) impedance levels, with respect to ground, to thereby determine an appropriately selected reference level against which the resistance value of thermistor R10 is compared.

The temperature within an enclosure (not shown) is sensed by measuring the effect of the temperature on the resistance value of thermistor R10 at junction J-1. Junction J-1 is connected to resistor R17 in series with a connector D and thermistor R10.

A sample voltage divider circuit includes resistors R16 and R15 (joined at junction J-1) which extend between a terminal E and ground. A D.C. regulated power supply (not shown) is connected to terminal E in order to Provide a sampling voltage that varies at junction J-1 in accordance with the resistance variations of thermistor R10. Although resistors R15 and R16 are fixed in value, resistors R17 and R10 constitute a variable resistance leg that is in parallel with R15. A capacitor C7 is connected between the junction J-1 and ground to provide a shunt for spurious noise pulses. A resistor R14 is connected between the junction J-1 and the negative input terminal of a comparator IC - 1. In this case the negative input terminal is termed the sampling input terminal for sensing the voltage at junction J-1. A capacitor C8 is connected between the negative input terminal and ground to stabilize the voltage at that terminal.

A reference voltage divider is defined by series connected resistors R19 and R20 between the terminal E and ground. Resistors 19 and 20 are connected at a junction J-2 that is also connected to the comparator IC-1 at its positive input terminal. In this example, the positive input terminal is referred to as the reference input terminal. The voltage present at junction J-2 serves as the reference input to the comparator IC-1.

A first of N switchable resistive networks is connected between junction J-2 and ground and comprises resistor R22 in series with the collector of transistor switch Q-6. The first switchable resistive network may be switched in parallel with resistor R20 by the appropriate biasing of the base of Q-6 with respect to its ground connected emitter.

A second of N switchable resistive networks is connected between the junction J-2 and ground and comprises resistor R21 in series with the collector of transistor Q-7. The second switchable resistive network may be switched in parallel with R20 by the appropriate biasing of the base of the transistor Q-7 with respect to its ground connected emitter.

The base of transistor Q-6 in the first switchable resistive network is connected to one side of a pull-up resistor R13 and to control terminal "A". Similarly, the base of transistor Q-7 is connected to one side of a pull-up resistor R12 and to control terminal "B". The other ends of resistors R12 and R13 are connected to a five volt supply so that when the respective control terminals A or B are set at a high (1) impedance logic level, the bias level at the respective bases will be pulled up to a relatively high voltage level. A transistor so biased will be switched to its conducting state to place its associated collector connected resistor in parallel with resistor R20. Conversely, when the respective control terminals A or B are switched to a relatively low (0) impedance logic level, the base of the corresponding transistor is biased near ground. A transistor so biased enters its high impedance nonconducting state to eliminate the parallel effects of the correspondingly associated resistive network on the reference junction J-2.

In this example, four separate reference levels are selectable by appropriate binary selection of control terminals A and B. The selected reference levels correspond to temperature values against which the voltage at J-1 (influenced by the temperature surrounding thermistor R-10) is compared.

The truth table shown in FIG. 2 details the relationship between various logic codes provided on control terminals A and B and the resulting output logic on comparator output terminal C. In the embodiment disclosed in the parent application, the output on terminal C indicates whether the temperature sensed by thermistor R10 is above or below "L" defined levels in a particular temperature range (wherein $L = 2^N$).

The selection of a value for Vb at terminal E determines the resolution of the A/N converter 17. A higher value of Vb gives greater resolution of the changing value to resistance in R10.

Levels I, II, III and IV are the "L" levels provided by the circuit shown at FIG. 1 which incorporates $N=2$ switchable resistive networks in parallel with a fixed reference resistor R20. The L levels define R adjacent ranges (wherein $R = L - 1$) of incremental temperature values. A determination of the temperature being below level I classifies the temperature as below the COOL range and, therefore, COLD. Above level I and below level II is classified in the COOL range. Above level II and below level III is classified in the NORMAL range. Above level III and below level IV is classified in the WARM range. Above level IV is classified as HOT.

Where the sensed temperature is compared with the level I reference value, the inputs of control terminals A and B in the A/D converter 17 are low (0) impedance logic levels to bias transistors Q-6 and Q-7 in their nonconducting states. In that condition, the reference voltage at junction J-2 will be at maximum value determined only by the reference resistive network formed by resistor R20 connected between junction J-2 and ground. The output of the comparator IC-1 provides a high (1) impedance output whenever the voltage at its negative input terminal is less than that at its positive input terminal. It provides a low (0) impedance output whenever the voltage at its negative input terminal is greater than that at its positive input terminal. Therefore, if the sensed temperature causes the voltage at J-1 to be below that applied to the junction J-2, the output impedance at terminal C will provide a high (1) logic output level and thereby indicate that the temperature is below Level I, or "COLD". If the output at terminal C is at a low (0) logic level, the sensed temperature will be determined to be above the selected reference value.

Accordingly, it can be seen that by stepwise selecting the appropriate logic levels to be applied to control terminals A and B and monitoring the output of terminal C, it is possible to step through the defined levels in a sequential manner until such time as the output terminal C indicates that the sampled voltage is within one of the R ranges or outside the ranges defined by the L levels.

It will be apparent that many modifications and variations may be implemented without departing from the scope of the novel concept of this invention. Therefore, it is intended by the appended claims to cover all such modifications and variations which fall within the true spirit and scope of the invention.

I claim:

1. A circuit for converting an analog electrical signal to a digital signal comprising:
    means containing sampling and reference input terminals and an output terminal for comparing said analog signal applied to said sampling terminal with a predetermined D.C. reference level applied to said reference input terminal to generate a first binary level output signal on said output terminal corresponding to said analog signal having a value determined by said comparing means as being greater than said predetermined reference level and a second binary level ouput signal having a value determined by said comparing means as being greater than said predetermined reference level;
    means for applying a predetermined reference level to said reference input terminal of said comparing means, wherein said reference level applying means includes a reference voltage divider circuit including at least two reference resistors connected in series between a D.C. voltage source and ground;
    N switchable resistive networks connected in parallel with at least one of the series resistors in said reference voltage divider circuit, wherein "N" is a positive integer being greater than zero (0);
    means for individually switching each of said switchable resistive networks into and out of electrical connection in parallel with said at least one of the series resistors in said reference voltage divider circuit, wherein each of said N switchable resistive networks includes at least one resistor connected in series with an electrical switch that is controllable to open and close in response to applied binary signals, and each switch being connected to a corresponding control terminal; and whereby, the selection of binary signals applied to said N control terminals and monitoring of the binarY output signal from said comparing means provides a combined digital binary output representation of the sampled analog signal value to be at least within R adjacent voltage ranges where $R = 2^N - 1$.

2. An analog to digital converter circuit as in claim 1 wherein the selection of binary signals applied to said N control terminals and monitoring of the binary output signal from said comparing means provides a digital representation of the sampled analog signal to be within and outside a number R of adjacent voltage ranges.

3. An analog to digital converter circuit as in claim 1 wherein said reference level applying means includes a first reference resistor electrically connected between the D.C. voltage source and the reference input terminal and said second reference resistor connected between the reference input terminal and ground.

4. An analog to digital converter circuit as in claim 3 wherein said N switchable resistive networks are connected between said reference input terminal and ground in parallel with each other and with said second reference resistor to provide L separate levels of reference voltage, where $L=2^N$.

5. A method of converting an analog electrical signal to a digital signal comprising the steps of:

providing means containing sampling and reference input terminals and an output terminal for comparing said analog signal applied to said sampling terminal with a predetermined D.C. reference level applied to said reference input terminal to generate a first binary level output signal on said output terminal corresponding to said analog signal having a value determined by said comparing means as being greater than said predetermined reference level and a second binary level ouput signal having a value determined by said comparing means as being greater than said predetermined reference level;

providing means for applying a predetermined reference level to said reference input terminal of said comparing means, wherein said reference level applying means includes a reference voltage divider circuit including at least two reference resistors connected in series between a D.C. voltage source and ground;

providing N switchable resistive networks connected in parallel with at least one of the series resistors in said reference voltage divider circuit, wherein "N" is a positive integer being greater than zero (0);

providing means for individually switching each of said switchable resistive networks into and out of electrical connection in parallel with said at least one of the series resistors in said reference voltage divider circuit wherein each of said N switchable resistive networks includes at least one resistor connected in series with an electrical switch that is controllable to open and close in response to applied binary signals, and each switch being connected to a corresponding control terminal;

applying a predetermined set of binary signals to the N control terminals to apply a predetermined one of L selectable D.C. reference levels to said reference input terminal, where $L=2^N$;

monitoring the output signal on said output terminal of said comparing means;

comparing the combination of said predetermined binary signals and said output signal with predetermined combinations to determine that said sampled voltage has a value that is relatively above or below the applied predetermined reference level;

repeating the applying step whenever the comparing step indicates the sampled voltage to be above the applied predetermined reference level with a different predetermined set of binary signals to said N terminals to select the next adjacent selected D.C. reference level.

6. A method as in claim 5, wherein the selection of binary signals applied to said N control terminals and monitoring of the binary output signal from said comparing means provides a digital representation of the sampled analog signal as being within and outside a number R of adjacent voltage ranges, and wherein $R=L-1$.

7. A method as in claim 5, wherein said reference level providing means includes a first reference resistor electrically connected between a D.C. voltage source and the reference input terminal and said second reference resistor connected between the reference input terminal and ground.

8. A method as in claim 7, wherein said N switchable resistive networks are connected between said reference input terminal and ground in parallel with each other and with said second reference resistor.

* * * * *